United States Patent
Purohit et al.

(10) Patent No.: US 12,406,122 B1
(45) Date of Patent: Sep. 2, 2025

(54) MODIFYING SCAN PATTERNS TO ENABLE BROADCASTING A SCAN ENABLE SIGNAL TO MULTIPLE CIRCUIT BLOCKS

(71) Applicant: Synopsys, Inc., Mountain View, CA (US)

(72) Inventors: Amit Gopal M. Purohit, Bangalore (IN); Denis Martin, Mountain View, CA (US); Paras Chhabra, Bengaluru (IN)

(73) Assignee: SYNOPSYS, INC., Sunnyvale, CA (US)

( * ) Notice: Subject to any disclaimer, the term of this patent is extended or adjusted under 35 U.S.C. 154(b) by 551 days.

(21) Appl. No.: 17/963,599

(22) Filed: Oct. 11, 2022

Related U.S. Application Data

(60) Provisional application No. 63/254,690, filed on Oct. 12, 2021.

(51) Int. Cl.

| | |
|---|---|
| G06F 30/333 | (2020.01) |
| G06F 11/263 | (2006.01) |
| G06F 11/267 | (2006.01) |
| G06F 11/27 | (2006.01) |
| G06F 30/20 | (2020.01) |
| G06F 30/3308 | (2020.01) |
| G06F 30/367 | (2020.01) |

(Continued)

(52) U.S. Cl.
CPC ........ *G06F 30/333* (2020.01); *G06F 11/0766* (2013.01); *G06F 11/263* (2013.01); *G06F 11/267* (2013.01); *G06F 11/27* (2013.01); *G06F 30/20* (2020.01); *G06F 30/3308* (2020.01); *G06F 30/367* (2020.01); *G06F 30/398* (2020.01); *H03K 3/011* (2013.01); *H03K 3/03* (2013.01); *H03K 5/00* (2013.01); *H03K 19/01* (2013.01)

(58) Field of Classification Search
CPC .... G06F 30/333; G06F 30/3308; G06F 30/20; G06F 30/367; G06F 30/398; G06F 11/263; G06F 11/267; G06F 11/27; G06F 11/373; G06F 11/0766; H01L 25/00; H03K 3/011; H03K 3/03; H03K 5/00; H03K 19/01
USPC ..... 716/136, 106, 111, 117; 703/16; 714/30, 714/33, 732, 733, 734, 735, 738; 326/41, 326/47, 101, 16
See application file for complete search history.

(56) References Cited

U.S. PATENT DOCUMENTS 4,317,200 A * 2/1982 Wakatsuki ..... G01R 31/318536
714/743
5,584,020 A * 12/1996 Takasaki ........ G01R 31/318342
714/33

(Continued)

FOREIGN PATENT DOCUMENTS

| EP | 2700961 A1 * | 2/2014 | ......... G01R 31/3171 |
| JP | 4903365 B2 * | 3/2012 | ....... G01R 31/31926 |

(Continued)

*Primary Examiner* — Phallaka Kik
(74) *Attorney, Agent, or Firm* — Laxman Sahasrabuddhe; Park, Vaughan, Fleming & Dowler LLP

(57) ABSTRACT

A first scan pattern may be received to test a first circuit block in an integrated circuit (IC) design and a second scan pattern may be received to test a second circuit block in the IC design. A first length of the first scan pattern may be different from a second length of the second scan pattern. The first scan pattern, the second scan pattern, or both the first scan pattern and the second scan pattern may be modified to make lengths of the first scan pattern and the second scan pattern equal.

20 Claims, 13 Drawing Sheets

(51) Int. Cl.
*G06F 30/398* (2020.01)
*H03K 3/011* (2006.01)
*H03K 3/03* (2006.01)
*H03K 5/00* (2006.01)
*H03K 19/01* (2006.01)
*G06F 11/07* (2006.01)
*H01L 25/00* (2006.01)

(56) References Cited

U.S. PATENT DOCUMENTS

| | | | | |
|---|---|---|---|---|
| 5,612,961 A | * | 3/1997 | Cabezas | H04L 5/1446 |
| | | | | 714/716 |
| 6,661,839 B1 | * | 12/2003 | Ishida | G01R 31/31921 |
| | | | | 375/240 |
| 7,392,503 B2 | * | 6/2008 | Wang | B82Y 10/00 |
| | | | | 716/52 |
| 9,110,139 B2 | * | 8/2015 | Wang | G01R 31/31926 |
| 2002/0133775 A1 | * | 9/2002 | Koe | G01R 31/318371 |
| 2003/0145268 A1 | * | 7/2003 | Wang | G01R 31/31835 |
| | | | | 714/738 |
| 2005/0229061 A1 | * | 10/2005 | Kang | G06F 11/263 |
| | | | | 714/738 |
| 2007/0162807 A1 | * | 7/2007 | Kurayama | G01R 31/31813 |
| | | | | 714/738 |
| 2010/0164099 A1 | * | 7/2010 | Sosogi | G11C 5/063 |
| | | | | 257/737 |
| 2014/0059384 A1 | * | 2/2014 | Tran | G01R 31/3171 |
| | | | | 714/E11.178 |
| 2014/0281371 A1 | * | 9/2014 | Thantry | G06F 9/30036 |
| | | | | 712/7 |

FOREIGN PATENT DOCUMENTS

| | | | | | |
|---|---|---|---|---|---|
| KR | 20000059512 A | * | 10/2000 | | G01R 31/318552 |
| KR | 20100086024 A | * | 7/2010 | | G01R 31/318536 |

* cited by examiner

| Core (i) | Delta ($\delta_i$) | Shift length ($n_i$) |
|---|---|---|
| Core1 | 5 | 100 |
| Core2 | 7 | 103 |
| Core3 | 4 | 105 |

| Core (i) | Delta ($\delta_i$) | Shift length ($n_i$) | Over-shifting cycles ($k_i$) |
|---|---|---|---|
| Core1 | 5 | 100 | 5,6,7,8,9,[10,]11,... |
| Core2 | 7 | 103 | [7,]8,9,... |
| Core3 | 4 | 105 | 4,[5,]6,... |

| Core (i) | Scan pattern shift length ($n_i$) | Delta ($\delta_i$) | Modified scan pattern shift length (K) |
|---|---|---|---|
| Core0 | 31 | 8 | 200 |
| Core1 | 200 | 6 | 200 |
| Core2 | 50 | 21 | 200 |

FIG. 13

| Core (i) | Scan pattern shift length ($n_i$) | Delta ($\delta_i$) | Modified scan pattern shift length (K) |
|---|---|---|---|
| Core0 | 65 | 8 | 73 |
| Core1 | 21 | 6 | 73 |
| Core2 | 50 | 21 | 73 |

FIG. 14

MODIFYING SCAN PATTERNS TO ENABLE BROADCASTING A SCAN ENABLE SIGNAL TO MULTIPLE CIRCUIT BLOCKS

RELATED APPLICATION

This application claims the benefit of U.S. Provisional Application Ser. No. 63/254,690, filed on 12 Oct. 2021, the contents of which are herein incorporated by reference in their entirety for all purposes.

TECHNICAL FIELD

The present disclosure generally relates to integrated circuit (IC) design, verification, and testing. More specifically, the present disclosure relates to modifying scan patterns to enable broadcasting a scan enable signal to multiple circuit blocks.

BACKGROUND

The importance of verifying the functionality of IC designs cannot be over-emphasized. Indeed, it would be impossible to use IC designs in mission-critical devices and applications if IC designs had not been thoroughly verified. An IC design may be verified by applying a set of test patterns to the IC design and comparing the responses generated by the IC design with the desired responses.

SUMMARY

Embodiments described herein may feature modifying scan patterns to enable broadcasting a scan enable signal to multiple circuit blocks. A first scan pattern may be received to test a first circuit block in an integrated circuit (IC) design. A second scan pattern may be received to test a second circuit block in the IC design. A first length of the first scan pattern may be different from a second length of the second scan pattern. The first scan pattern, the second scan pattern, or both the first scan pattern and the second scan pattern may be modified to make lengths of the first scan pattern and the second scan pattern equal. A scan enable signal may be broadcast to the first circuit block and the second circuit block.

In some embodiments described herein, modifying the first scan pattern, the second scan pattern, or both the first scan pattern and the second scan pattern may include determining a first value based on scan chain lengths in the first circuit block, and increasing the first length of the first scan pattern by at least the first value. The first value may be a first difference between a longest scan chain length and a shortest scan chain length in the first circuit block.

In some embodiments described herein, modifying the first scan pattern, the second scan pattern, or both the first scan pattern and the second scan pattern may include determining a second value based on scan chain lengths in the second circuit block and increasing the second length of the second scan pattern by at least the second value. The second value may be a second difference between a longest scan chain length and a shortest scan chain length in the second circuit block.

In some embodiments described herein, modifying the first scan pattern, the second scan pattern, or both the first scan pattern and the second scan pattern may include pre-padding and/or post-padding the first scan pattern, the second scan pattern, or both the first scan pattern and the second scan pattern. Pre-padding the first scan pattern may include adding a portion of the first scan pattern to the front of the first scan pattern. Pre-padding the second scan pattern may include adding a portion of the second scan pattern to the front of the second scan pattern.

BRIEF DESCRIPTION OF THE FIGURES

The disclosure can be understood based on the detailed description given below and the accompanying figures. The figures, examples and embodiments are for illustrative purposes, and do not limit the scope of the disclosure. Furthermore, the figures are not necessarily drawn to scale.

FIGS. 13-14 illustrate examples of scan pattern shift length for different IC designs in accordance with some embodiments described herein.

DETAILED DESCRIPTION

Figure 1A:
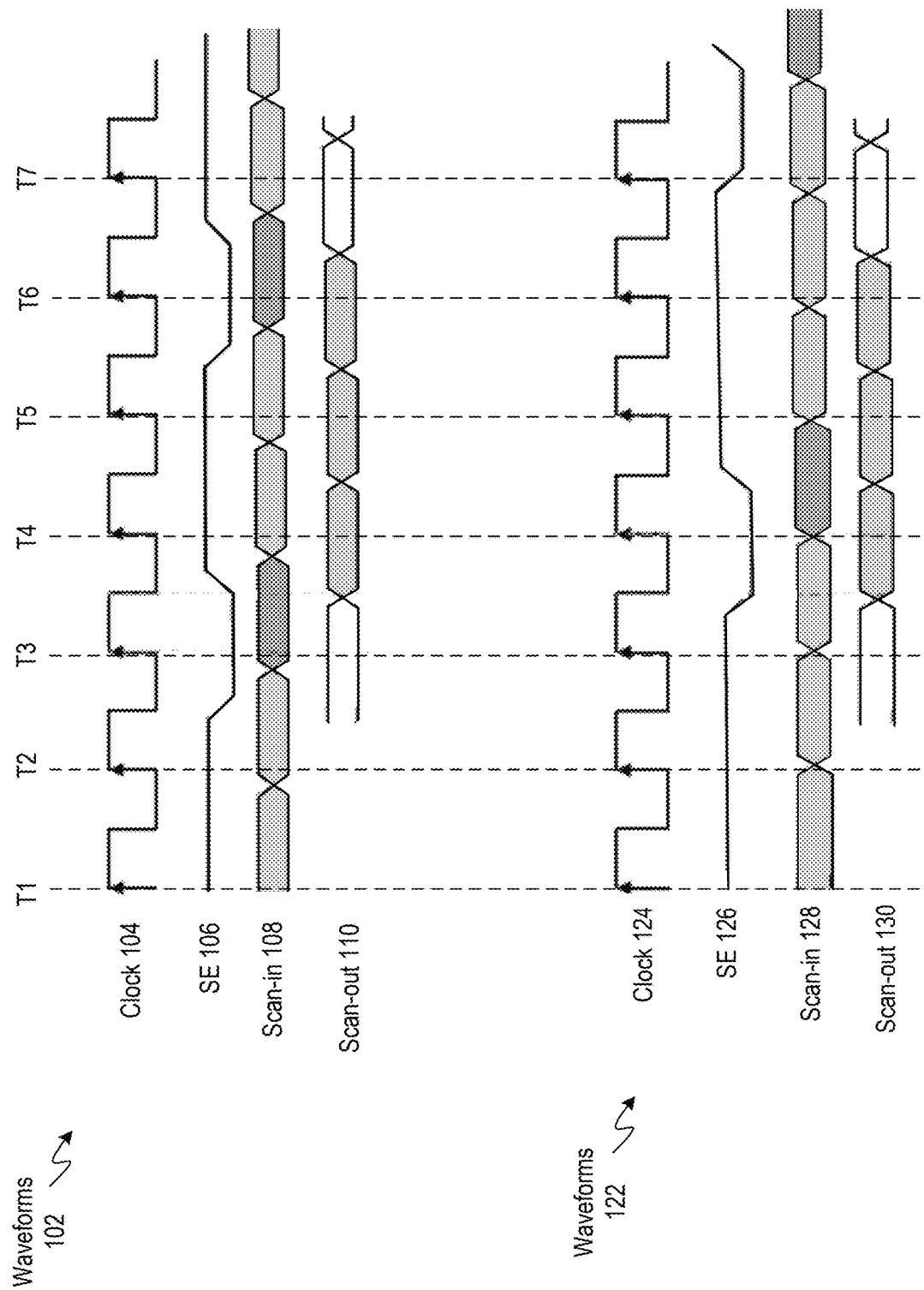
FIGS. 1A-1B illustrate aligning scan patterns over multiple cores in accordance with some embodiments described herein.

In design for test (DFT), scan chains may be included in an IC design and be used for testing IC chips. DFT approaches may allow an IC chip to be tested easier, faster, and with more coverage. Specifically, in DFT approaches, a set of flip-flops or a set of scan cells (hereinafter referred to as "flops") in the IC design (the set of flip-flops may include all flip-flops in the IC design) may be used as scan chain flip-flops that are stitched together to create scan chains. Improving the verification and/or test coverage of an IC chip can improve the yield. DFT approaches may facilitate identification of root causes of logic failures in IC designs. During testing of an IC chip, scan chains may be tested first and then used to shift test inputs and capture test outputs from the IC chip.

As IC design grow larger and the number of scan flops increase, the length of each scan chain may also increase.

Each scan pattern is typically loaded serially into the scan chains and unloaded serially from the scan chains, which causes the amount of time used for testing an IC design to be proportional to the scan chain length. Increasing the number of scan chains can reduce the scan chain length, which can reduce the test time. However, increasing the number of scan chains may also increase the number of test pins on the chip that are used for scanning-in stimulus data and scanning-out response data. Typically, the number of scan chains is limited by the tester which is used for testing the IC design.

In DFT, automatic test pattern generation (ATPG) may be used to generate scan patterns with a minimum shift length to minimize the amount of time used for testing the IC design. In an IC design that includes multiple cores (e.g., a system on chip (SoC) design), the cores may be tested by using ATPG in parallel to each other. Different cores may have different scan pattern shift lengths. This may create an issue at the top level of the IC design (e.g., the SoC level) where different cores under test are desired to be in the shift state or the capture state at the same time. Different cores would be in the same state (i.e., shift state or capture state) if the scan pattern shift lengths are the same for the different cores. However, because ATPG may be performed in parallel for the different cores, the scan pattern shift lengths for the different cores may not be known beforehand and may be different when ATPG completes generating the scan patterns for the different cores in parallel.

A user may specify a scan pattern shift length before test patterns are generated for the different cores. However, if the user-specified scan pattern shift length is greater than what is necessary, then the resulting ATPG scan patterns will waste test time because the scan patterns will be longer than necessary. On the other hand, if the user-specified scan pattern shift length is shorter than what is necessary, then the generated ATPG scan patterns may have problems at the SoC level (even though some of the scan patterns may work at the core level). Further, if an engineering change order (ECO) is applied to the IC design, then the scan pattern shift lengths may change. Moreover, some IC designs may already have scan chains and may have associated ATPG scan patterns that already have been generated and validated. For such IC designs, it is not desirable to regenerate scan patterns that have a different scan pattern shift length.

Embodiments described herein may adjust core scan patterns based on a given shift length. Specifically, embodiments described herein may adjust shift length of already validated core patterns without any design change. Some embodiments described herein may determine an optimal scan pattern shift length at the top level (e.g., at the SoC level) for an IC design (e.g., an SoC) which includes different cores with different types of scan architectures. The types of scan chain architectures handled by embodiments described herein include, but are not limited to, uncompressed and compressed scan chain architectures. Embodiments described herein can adjust the scan pattern shift length of cores without any design modifications to the cores. Some embodiments described herein determine a single scan pattern shift length (which may be the minimal scan pattern shift length) for the different cores of the IC design (e.g., an SoC), and then update (if required) the scan patterns for the different cores so that the different cores in the IC design have the same scan pattern length at the top level. Moreover, embodiments described herein may use validated core scan patterns, thus eliminating the need for redoing scan pattern generation and validation when validated core scan patterns are already available.

Embodiments described herein enable core level DFT insertion and scan pattern generation in complete silos to other cores without predicting scan shift length of other cores in IC designs (e.g., SoCs) where multiple cores are tested in parallel. If an ECO is applied to a particular core, then embodiments described herein may regenerate the scan patterns for that core, but not generate scan patterns for other cores, which may save a large amount of time (because pattern generation and validation for the other cores may use a large amount of time). Embodiments described herein ensure that the same scan pattern shift length is used for all cores, which ensures that all cores under test are in shift state or capture state at the same time, and which enables sharing of a scan enable signal at the top level of the IC design (e.g., an SoC).

Figure 1B:
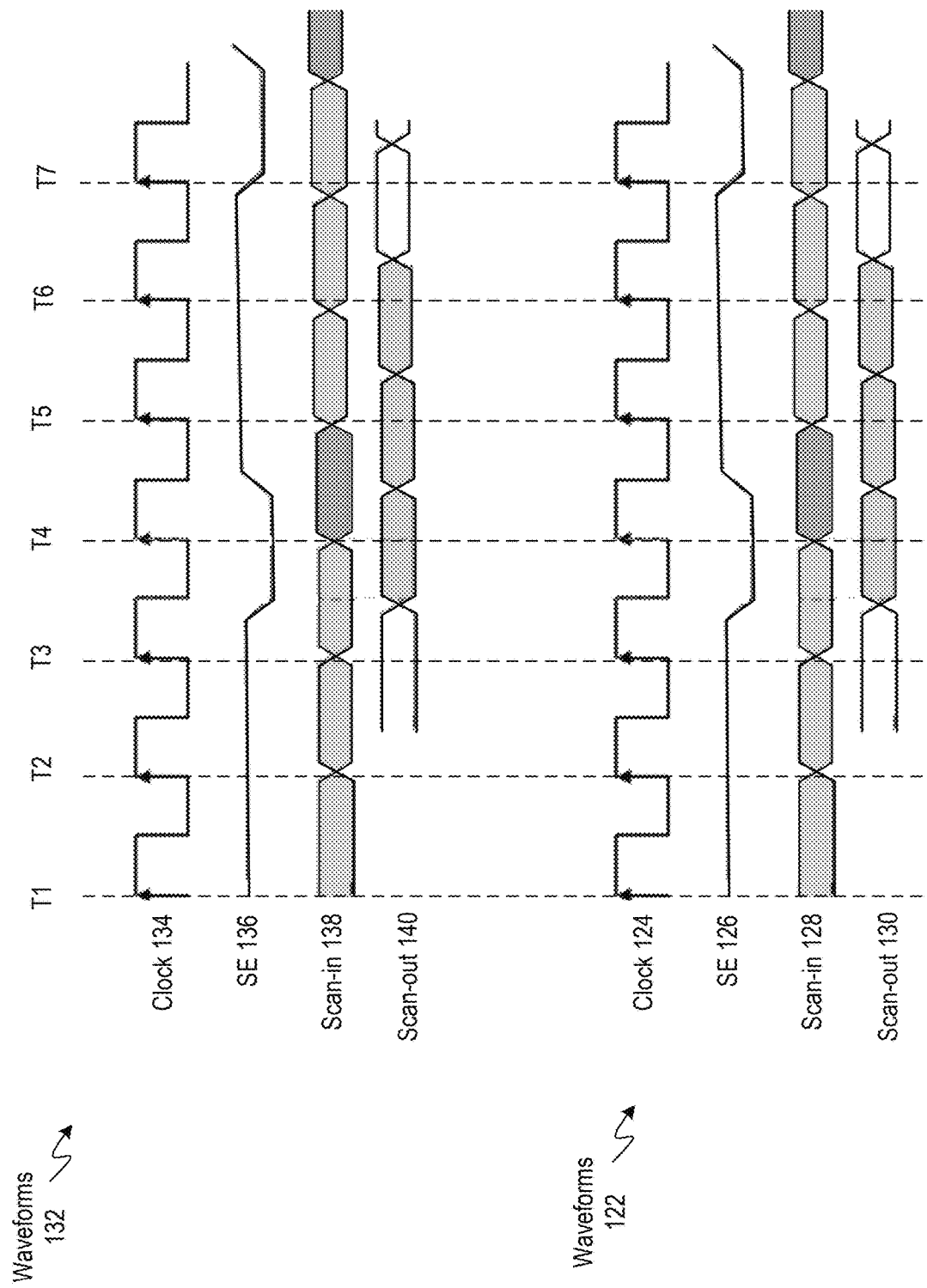

FIGS. 1A-1B illustrate aligning scan patterns over multiple cores in accordance with some embodiments described herein.

The term "circuit block" may refer to a portion of an IC design. The term "core" may refer to a circuit block at the top level of the IC design. In FIG. 1A, waveforms 102 may correspond to a first core, and include the following signals: clock 104, scan enable 106, scan-in 108, and scan-out 110. Waveforms 122 may correspond to a second core, and include the following signals: clock 124, scan enable 126, scan-in 128, and scan-out 130. The positive clock edges of clocks 104 and 124 are aligned and have been labeled T1-T7.

Scan-in 108 may represent the data scanned into the scan chains in the first core and scan-out 110 may represent the data scanned out of the scan chains in the first core. Scan-in 128 may represent the data scanned into the scan chains in the second core and scan-out 130 may represent the data scanned out of the scan chains in the second core.

In the shift state, data may be shifted through the scan chains, whereas in the capture state, circuitry in a core may be cycled for one or more clock cycles and responses may be sampled by the scan chains. When a scan enable signal is asserted, the scan chains may operate in a shift state, and when a scan enable signal is deasserted, the scan chains may operate in a capture state. Scan enable 106 may be used to change the state of the scan chains in the first core between a shift state and a capture state. Scan enable 126 may be used to change the state of the scan chains in the second core between a shift state and a capture state.

The scan chains in the first core are in the shift state at clock edges T1 and T2, in the capture state at clock edge T3, in the shift state at clock edges T4 and T5, in the capture state at clock edge T6, and in the shift state at clock edge T7. However, the scan chains in the second core are in the shift state at clock edges T1, T2, and T3, in the capture state at clock edge T4, in the shift state at clock edges T4, T5, and T6, and in the capture state at clock edge T7. Thus, a scan enable signal cannot be broadcast to the first core and the second core because the scan chains in the two cores switch between the shift state and the capture state at different clock edges. The term "broadcast" may refer to providing the same signal to multiple input pins. Thus, broadcasting a scan enable signal to multiple circuit block may refer to providing the same scan enable signal to multiple circuit blocks.

In some embodiments described herein, the scan patterns that are provided to the first core may be modified so that the scan chains in both the first core and the second core switch between the shift state and the capture state at the same clock edge.

For example, waveforms 132 in FIG. 1B may correspond to the first core with modified scan patterns, and include the following signals: clock 134, scan enable 136, scan-in 138, and scan-out 140. In waveforms 132, the scan chains in the first core are in the shift state at clock edges T1, T2, and T3, in the capture state at clock edge T4, in the shift state at clock edges T4, T5, and T6, and in the capture state at clock edge T7. Waveforms 122 from FIG. 1A are shown in FIG. 1B to facilitate comparison with waveforms 132. As shown in FIG. 1B, a scan enable signal may be broadcast to the first core and the second core because the scan chains in the two cores switch between the shift state and the capture state at the same clock edges.

Figure 2:
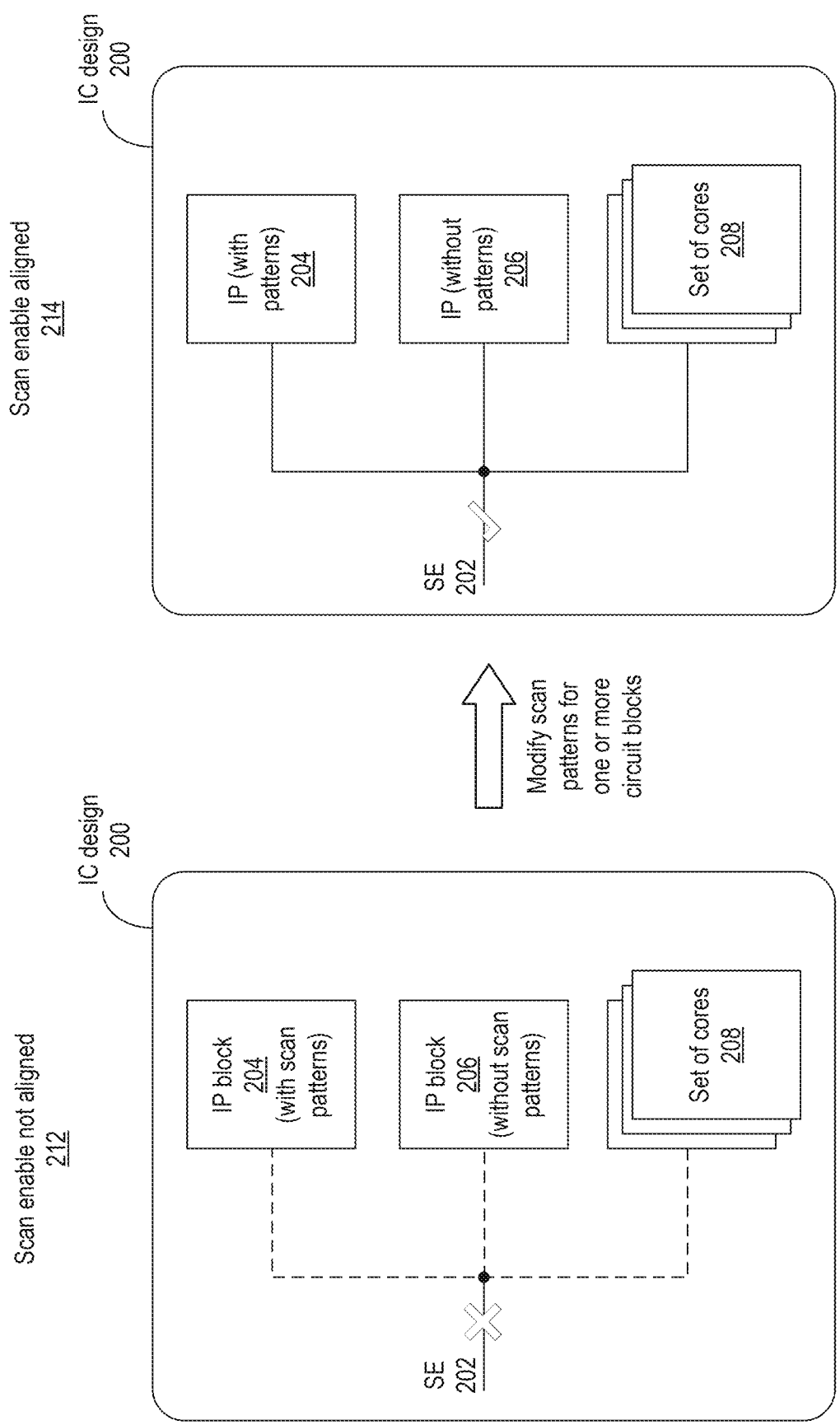
FIG. 2 illustrates modifying scan patterns to enable broadcasting a scan enable signal to multiple circuit blocks in accordance with some embodiments described herein.

FIG. 2 illustrates modifying scan patterns to enable broadcasting a scan enable signal to multiple circuit blocks in accordance with some embodiments described herein.

IC design 200 may include multiple circuit blocks, which may include, but not limited to, an intellectual property (IP) block 204 which may have accompanying scan patterns, IP block 206 which may not have accompanying scan patterns, and a set of cores 208. The term "IP block" may refer to a circuit block that is provided by a third party. The scan enable signal 202 may not be aligned (at 212) for the IP blocks 204 and 206 and the set of cores 208. In other words, the scan patterns may require different circuit blocks to switch between a shift state and a capture state at different clock edges. Thus, scan enable signal 202 cannot be broadcast to the IP blocks 204 and 206 and the set of cores 208 (shown by an "X" symbol and dashed lines at 212).

Embodiments described herein may modify the scan patterns for one or more circuit blocks so that the scan enable signal 202 is aligned (at 214) for the IP blocks 204 and 206 and the set of cores 208. As a result, scan enable signal 202 may be broadcast to the IP blocks 204 and 206 and the set of cores 208 (shown by a check symbol and solid lines at 214).

In DFT, circuitry may be tested using a load-unload mechanism, where scan flops in scan chains are set to a defined state using a load mechanism and state of the scan flops are compared at output using an unload mechanism. To save test time, loading of new data and unloading of captured data may be performed in parallel. Thus, in these embodiments, each scan pattern may include (1) unloading the previously captured data, (2) loading new scan pattern data into the scan flops, and (3) switching the scan chain to a capture state so that the response of the design under test may be captured based on the scan pattern data that was loaded into the scan flops.

The scan chain length may be defined as the number of scan flops in a scan chain. The scan pattern shift length may be defined as the number of clock edges (or clock cycles) required to load or unload a scan pattern, which can be greater than the scan chain length. Loading and unloading of scan patterns may be performed in a serial fashion. Thus, the test time may be directly proportional to the scan pattern shift length.

In some embodiments, the number of test pins may be less than the number of scan chains in an IC design. In these embodiments, the DFT circuitry may include a decompressor circuit which converts the scan patterns received at the test pins and feeds the decompressed scan patterns into the scan chains. Further, the DFT circuitry may include a compressor circuit that compresses the responses unloaded from the scan chain and outputs the compressed responses on the test pins.

Some embodiments described herein may compute a delta value for each circuit block. The delta value computation may be dependent on the DFT compression circuitry (i.e., the delta computation may be different for different compression circuitries). At the top level of the IC design, each circuit block may have a different shift length and a different delta. In some embodiments described herein, a scan pattern shift length (which may be the minimum scan pattern shift length) may be calculated as follows.

Let K be the scan pattern shift length across all circuit blocks (K need not be the maximal length of scan chains over the cores), and for circuit block i, where $1 \leq i \leq M$, let $n_i$ be the maximum scan chain length of circuit block i and let $\delta_i$ be the difference between the longest and the shortest scan chain in circuit block i. Then, for circuit block i, $k_i$ over-shifting cycles may be determined, such that $n_i + k_i = K$, subject to $\delta_i \leq k_i$. The term "over-shifting cycles" refers to increasing the scan pattern shift length. For example, in FIGS. 1A-1B, the scan pattern shift length for the first core was over-shifted by one cycle (e.g., compare waveforms 102 in FIG. 1A and waveforms 132 in FIG. 1B).

Figures 3, 4, 5:
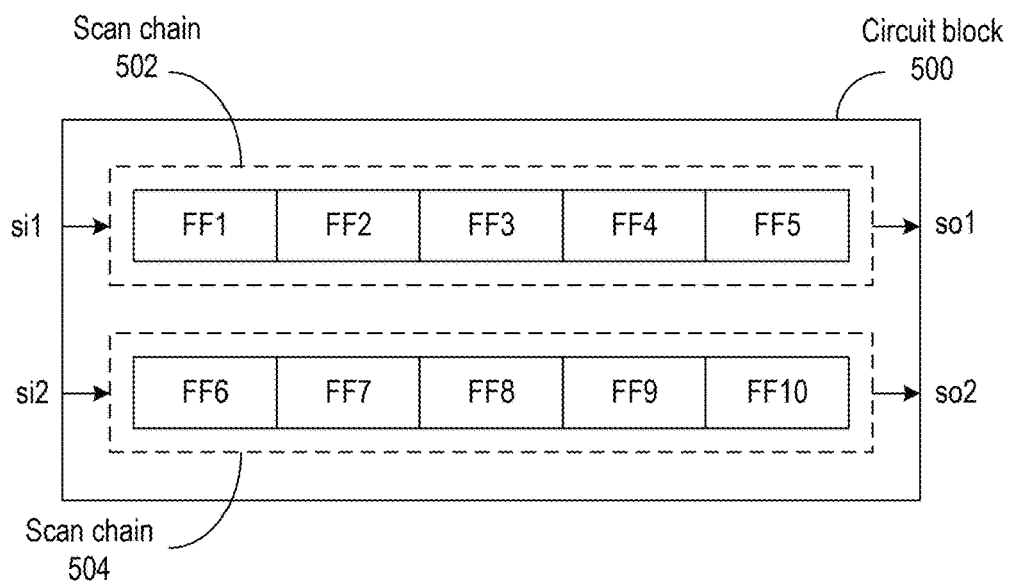
FIGS. 3-4 illustrate an example of modifying scan patterns to enable broadcasting a scan enable signal in accordance with some embodiments described herein.
FIGS. 5-8 illustrates loading and unloading scan patterns using two scan chains in accordance with some embodiments described herein.

FIGS. 3-4 illustrate an example of modifying scan patterns to enable broadcasting a scan enable signal in accordance with some embodiments described herein.

The table in FIG. 3 illustrates the $\delta_i$ and $n_i$ values for an IC design with three cores Core1, Core2, and Core3. The table in FIG. 4 illustrates the possible $k_i$ values ($\delta_i \leq k_i$), i.e., the number of over-shifting cycles that may be added to the scan patterns of the three cores. A $k_i$ value for each core may be selected (highlighted in FIG. 4) so that each core satisfies the condition $n_i + k_i = K$. Specifically, selecting $k_i$ as 10, 7 and 5 for Core1, Core2 and Core3, respectively, satisfies above condition which makes "K" equal to 110, which is the modified scan pattern shift length.

The delta computation may depend on the DFT implementation. Once the delta for each circuit block has been computed, the over-shifting cycles for the circuit blocks may be computed using the above-described process. Next, the scan pattern for each circuit block may be modified based on the over-shifting cycles for each circuit block.

Specifically, for uncompressed DFT implementations (i.e., DFT implementations that do not include compressor/decompressor circuitry), unloading a response may not depend upon the next scan pattern that is desired to be loaded. In these embodiments, the unloading a response may depend on the previous scan pattern that was loaded. On the other hand, in DFT implementations that use compressor/decompressor circuitry, unloading a response may depend on the next scan pattern that is desired to be loaded. Thus, the delta value for uncompressed DFT implementations is equal to "1," i.e., the scan pattern shift length for uncompressed DFT implementations may be increased without any constraint on the minimum amount of increase that is allowed when increasing the shift length. In other words, for uncompressed DFT implementations, $\delta_i = 1$ and $k_i \geq 1$.

FIGS. 5-8 illustrates loading and unloading scan patterns using two scan chains in accordance with some embodiments described herein.

In FIG. 5, circuit block 500 may include scan chains 502 and 504, each of which may have a scan chain length of five. Specifically, scan chain 502 may include flops FF1-FF5 and scan chain 504 may include flops FF6-FF10. Scan chain 502 may load a scan pattern through scan-in port si1, and scan chain 504 may load a scan pattern through scan-in port si2. A scan pattern may be shifted into a scan chain using the scan-in port so that a desired value is loaded into each flop of the scan chain.

Once the desired values have been loaded into the flops of the scan chains, the scan chains may be switched to a capture state. In the capture state, the IC design may be clocked for one or more clock cycles, and the response data may be captured in the flops in the scan chains. The scan chains may then be switched to the shift state, and the response data may be shifted out of the scan chains and compared with the expected response data.

Figure 6:
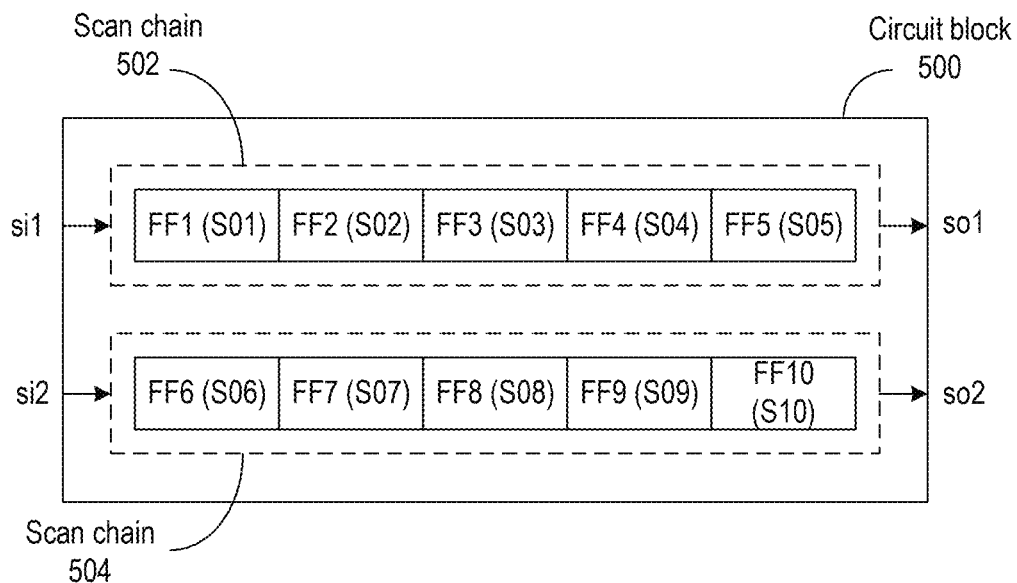
Figure 7:
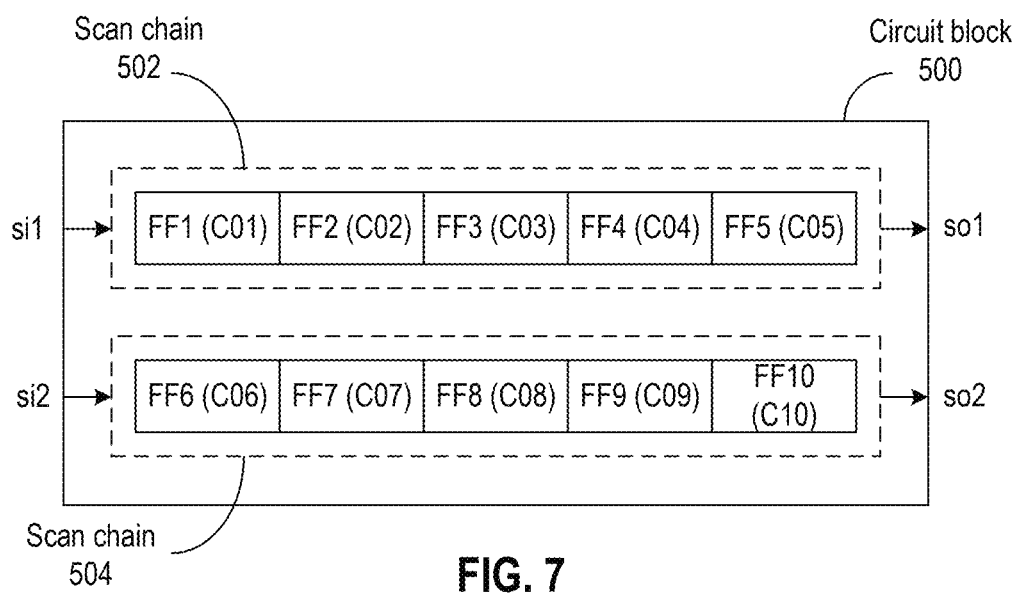

FIG. 6 illustrates scan data S01 through S10 being loaded into the scan chains. For example, scan data S01 is loaded into flop FF1, scan data S02 is loaded into flop FF2, and so forth. FIG. 7 illustrates response data C01 through C10 being captured in the scan chains. For example, response data C01 is captured in flop FF1, response data C02 is captured in flop FF2, and so forth.

At the same time the response data are shifted out of the scan chains, the next scan pattern may be loaded into the scan chains. The process of concurrently unloading response data and loading the next scan pattern may be referred to as a load-unload process.

Figure 8:
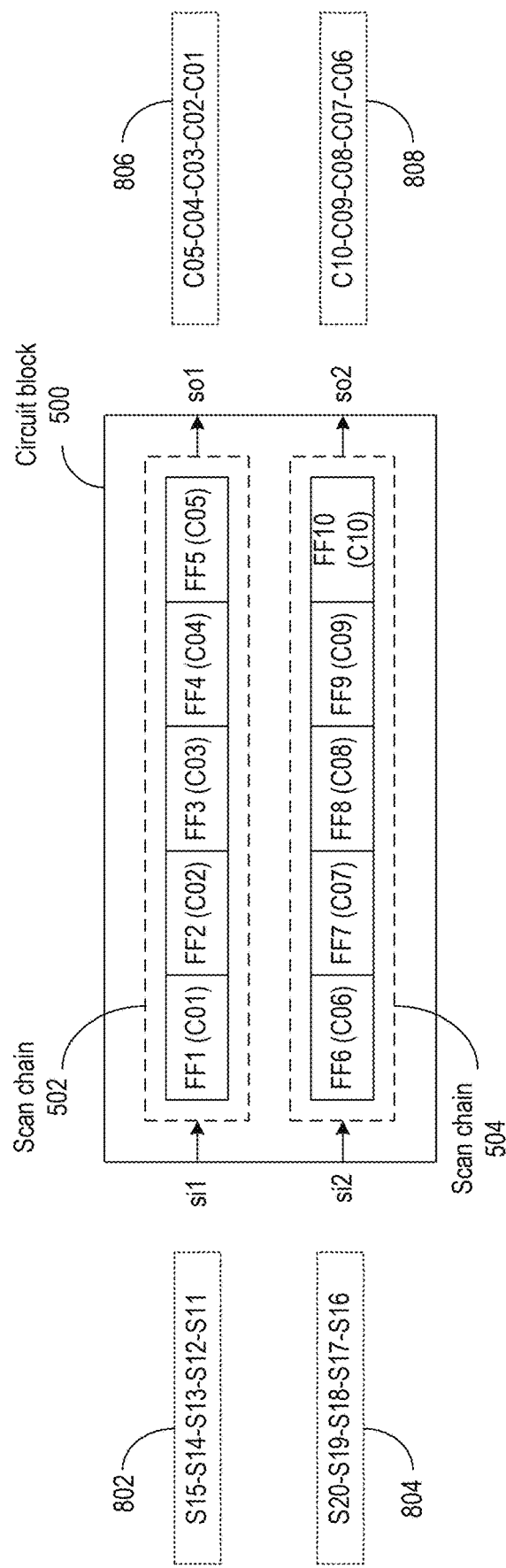

FIG. 8 illustrates a load-unload process where the new scan data may be loaded into the scan chains while the response data is unloaded from the scan chains. Specifically, the response data 806 may be unloaded from scan chain 502. Response data 806 includes the data from the flop FF1 through FF5, which may be shifted out one flop per clock edge. Thus, the data of FF5 (i.e., C05) are unloaded first, then the data of FF4 (i.e., C04), and so forth. Response data 808 may be unloaded from scan chain 504. At the same time the response data are shifted out of the scan chains 502 and 504, the next scan pattern may be loaded into the scan chains. For example, scan patterns 802 and 804 may be shifted into scan chains 502 and 504, respectively, at the same time response data 806 and 808 are being shifted out of scan chains 502 and 504, respectively.

The testing time may be decided by the scan shift length. To reduce or minimize the testing time, ATPG may generate scan patterns with a reduced or minimum shift length unless directed otherwise by the user. For circuit blocks that use uncompressed DFT circuitry, scan patterns may be updated by pre-padding the scan pattern with a known pattern, e.g., a sequence of "0s." The length of the pre-padding may be equal to the difference between the desired scan pattern shift length and the current scan pattern shift length. The output data corresponding to the pre-padding data may be masked for a count of cycles that is equal to the difference in the shift length.

For circuit blocks with DFT circuitry that uses compression, each unload operation may be tightly coupled with the load operation of the previous scan pattern and the current scan pattern. In other words, loading of the previous scan pattern affects the captured data, and the current scan pattern loading operation affects the expected data at the output. In a circuit block where all compressed scan chains have the same chain length, padding a "0" value may be performed while masking for same number of cycles at the output. However, in many situations, the compressed scan chains may not have the same scan chain length.

Figure 9:
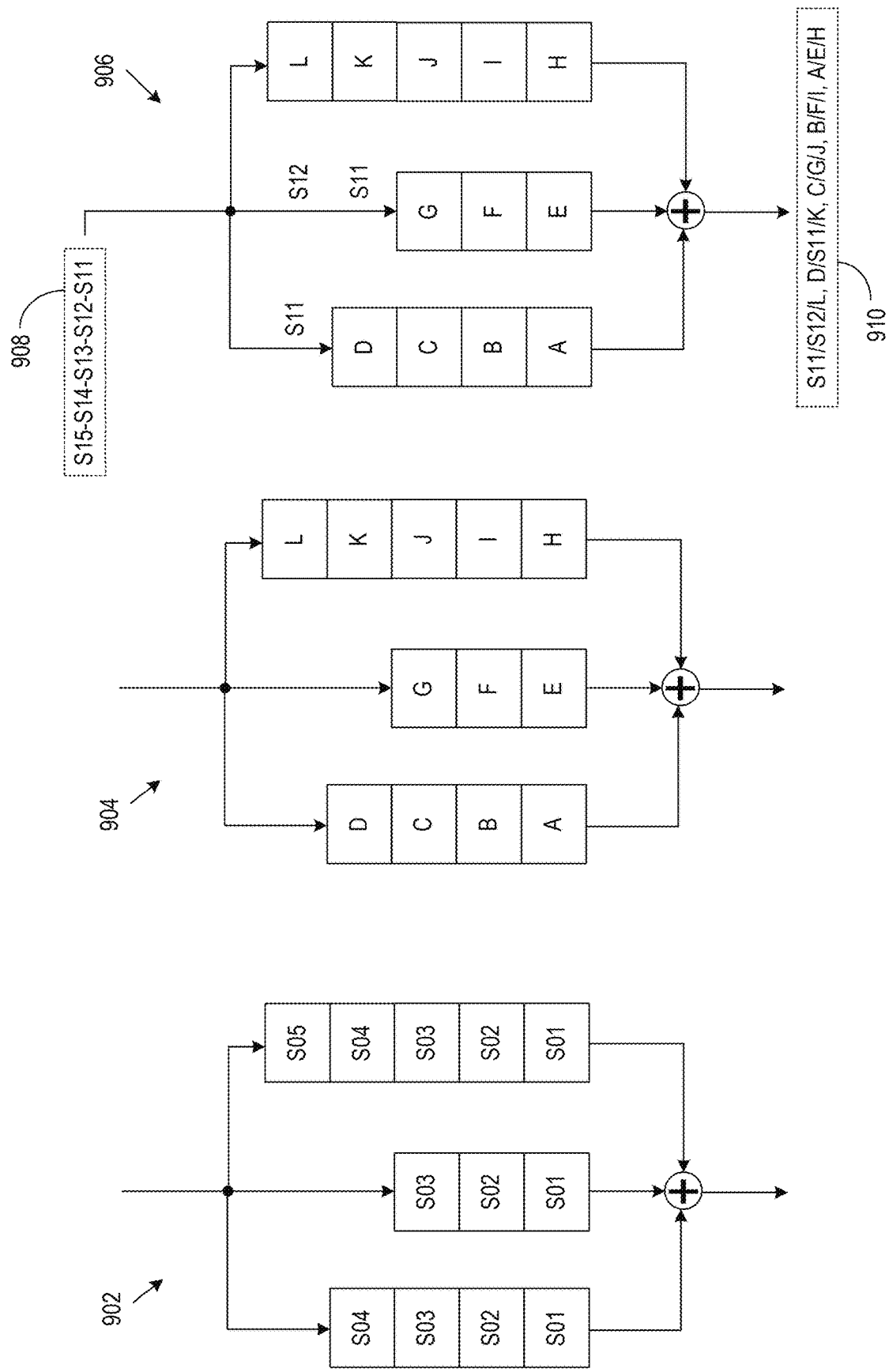
FIG. 9 illustrates a circuit block that uses scan chain compression and that includes unbalanced scan chain lengths in accordance with some embodiments described herein.

FIG. 9 illustrates a circuit block that uses scan chain compression and that includes unbalanced scan chain lengths in accordance with some embodiments described herein.

Compression circuitry that includes three compressed chains with scan chain lengths of 4, 3, and 5, respectively, are illustrated in FIG. 9. Scan data is broadcasted into the three scan chains while the gated output of the three scan chains (e.g., the XOR of the three scan chains as shown in FIG. 9) is compared with the expected data.

Three different time instances are illustrated in FIG. 9. At time instance 902, a first pattern load has been performed, and the scan flop contents are denoted using symbols S01 to S05. At time instance 904, responses have been captured for the first pattern load, and the scan flop contents after capturing responses are represented by symbols A to L.

When the captured responses A-L are unloaded, a second scan pattern may be loaded concurrently. At time instance 906, the second scan pattern 908 is shown with data S11-S15. The following compressed response data 910 may be unloaded: S11/S12/L, D/S11/K, C/G/J, B/F/I, and A/E/H. The representation "A/E/H" refers to the output after compressing scan flop contents A, E, and H as shown in FIG. 9. For example, if the compression circuitry performs an XOR operation, then "A/E/H" refers to the XOR of A, E, and H. In compressed response data 910, A/E/H is unloaded first and S11/S12/L is unloaded last.

The unloaded response data (which is compared with the expected response data) depends on the next scan pattern that is being loaded. For example, the unloaded response data "D/S11/K" combines the responses D and K (which are responses to a previous scan pattern) with S11 which is a value in the next scan pattern 908. If S11 is not unloaded with D and K, then the response data will not match the expected response. Likewise, unloaded response data "S11/S12/L" combines the response L with S11 and S12 which are values from the next scan pattern 908. If S11 and S12 are not unloaded with L, then the response data will not match the expected response.

Thus, when increasing the scan pattern shift length of a circuit block that includes unbalanced and compressed scan chains, the first "n" bits of a scan pattern (where "n" is equal to difference of longest and shortest compressed chain) may be repeated to ensure that response data (e.g., D and K in FIG. 9) are combined with the correct scan pattern data (e.g., S11 in FIG. 9). The difference between the longest and the shortest compressed chain length is denoted by δ as explained above.

Circuit blocks that use an unbalanced and compressed scan chain (e.g., the scan chain shown in FIG. 9) have a restriction on the minimum shift length by which scan pattern shift length can be increased. In other words, for circuit blocks that use compressed scan chains, the increase in shift length may be greater than or equal to δ. In addition to ensuring that the increase in the shift length is greater than or equal to δ, embodiments described herein also ensure that the first δ bits are repeated when modifying the scan pattern shift length. For IC designs where the scan pattern input data is driven by a shift register, the δ may include the shift register length as well if the scan pattern input data is driven by different pins of the shift register. The difference in clock cycles for reaching the scan pattern input data should be added while calculating the δ for a circuit block.

Figure 10B:
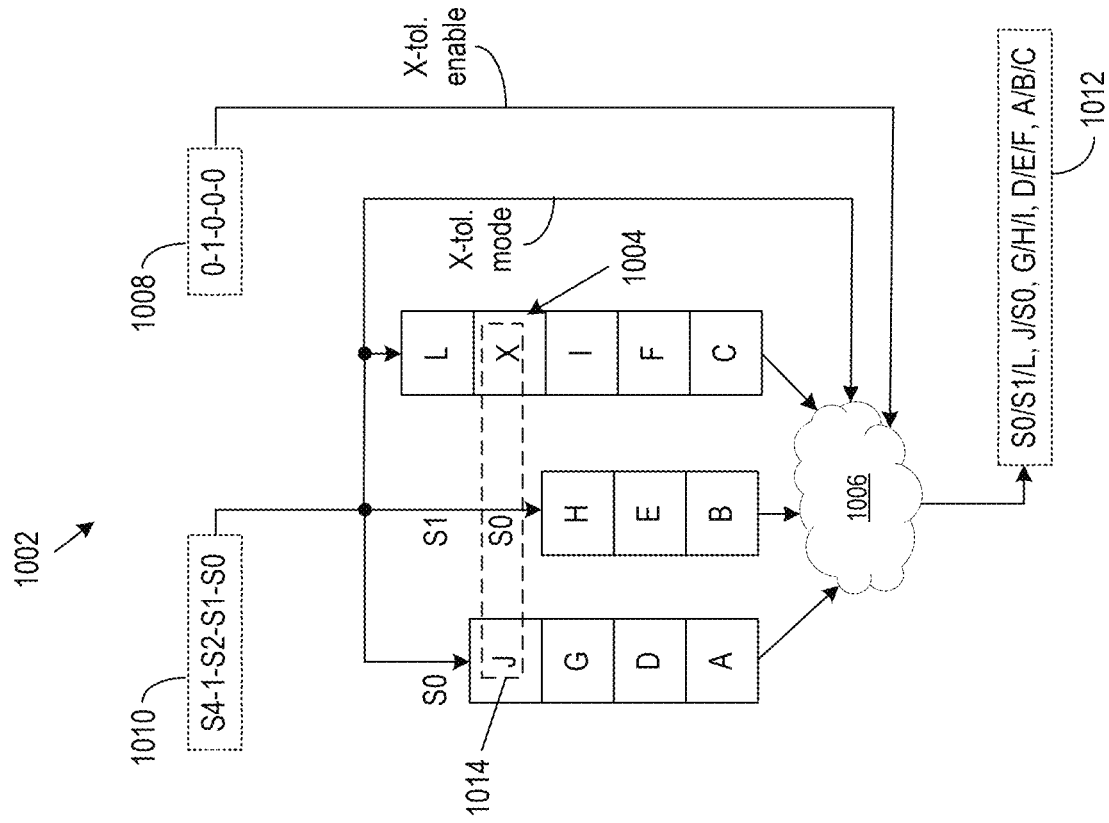
FIGS. 10A-10B illustrate a circuit block with high X-tolerance compression without shift registers in accordance with some embodiments described herein.
Figure 10A:
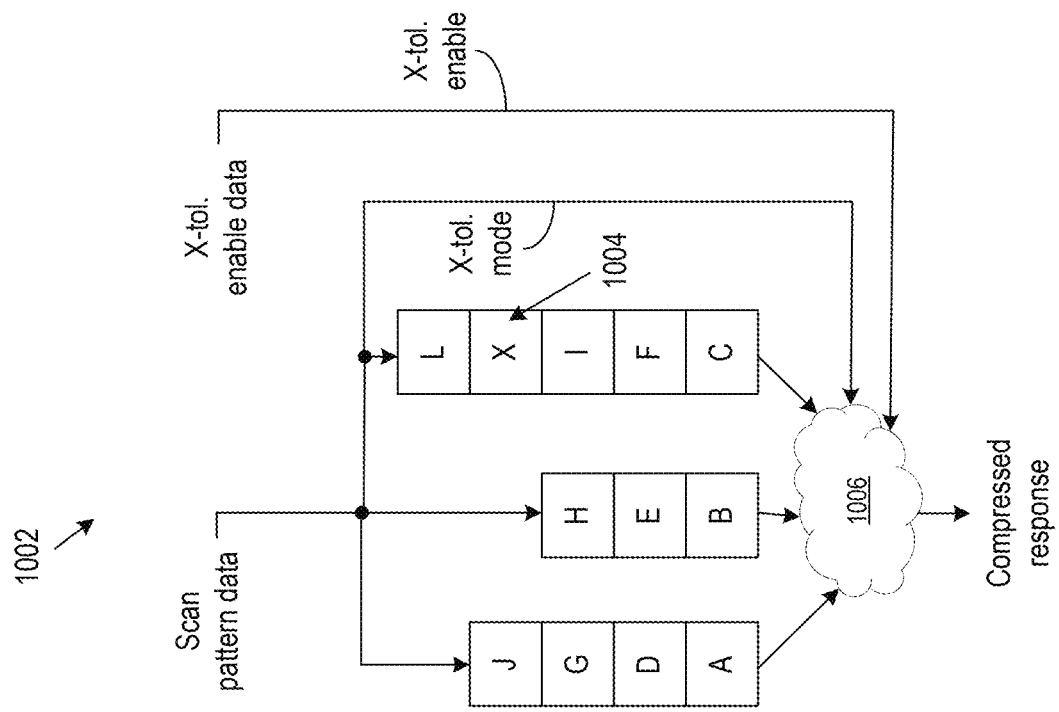

FIGS. 10A-10B illustrate a circuit block with high X-tolerance compression without shift registers in accordance with some embodiments described herein.

Embodiments described herein can handle circuit blocks that use high X-tolerance compression where separate scan-in paths are used for chain masking and X-tolerance mode selection. Circuit blocks with high X-tolerance compression may include scan-in pins that are used to specify the X-tolerance mode and X-tolerance enable pins. The X-tolerance mode pins may be used to specify the X-tolerance mode for the compression and the X-tolerance enable pins may be used to specify when to mask the captured data. The "X" symbol represents an unknown or "don't care" value.

In FIG. 10A, scan chain 1002 includes three compressed chains with scan chain lengths of 4, 3, and 5, respectively. Scan flop 1004 (which is the fourth scan flop from the bottom in the rightmost chain) has captured an "X," which can lead to coverage loss if it is not masked because it may cause the captured data in the other scan flops (i.e., fourth scan chain cell from the bottom in the leftmost chain which captured a "J") to be un-observable. To prevent degradation of coverage due to captured "X" values in scan cells, such "X" values can be masked during expected data comparison. Masking a value causes the value to be ignored (e.g., by always setting the value to a constant value) when generating the compressed response data.

The "X-tolerance enable" and "X-tolerance mode" signals may be used to select when to mask data and which chain to mask, respectively. Specifically, logic 1006 may receive the unloaded values from the three scan chains, receive the X-tolerance mode signal, and the X-tolerance enable signal. Logic 1006 may mask an unloaded value in a scan chain based on the X-tolerance mode signal, and the X-tolerance enable signal, and generate the compressed response.

In FIG. 10B, the next scan pattern data 1010 is broadcast to the three scan chains and the X-tolerance enable data 1008 is provided as X-tolerance enable signal. The next scan pattern data 1010 may have value S0 such that, in 4th shift (i.e., data values 1014), the X-tolerance enable signal is assigned a "1" value and the X-tolerance mode signal is assigned a "1" value (i.e., the S0 value may be 1) to select the rightmost chain for masking. The compressed response 1012 illustrates the result of masking. Specifically, A/B/C is unloaded first, and in the fourth cycle, J/S0 is unloaded instead of J/S0/X because the "X" value in the rightmost scan chain was masked. In embodiments described herein, the X-tolerance enable pins may be post-padded rather than pre-padded.

It is important to ensure that the scan chain selection data does not change due to shift length adjustment. Embodiments described herein can handle cases where the X-tolerance mode data is modified due to shift length adjustment. Specifically, some embodiments described herein may divide the load-unload patterns into two patterns, thereby performing an unload of the current patterns and then a load of next pattern, respectively. Comparison with expected data may be performed in the unload portion of the divided pattern while loading of the next pattern is performed.

Some embodiments described herein may modify scan patterns once the modified scan pattern shift length is determined. Specifically, once the "K" value has been computed for the IC design, the scan pattern for each circuit block may be modified by pre-padding or post-padding "K-$n_i$" bits, where $n_i$ denotes the scan pattern shift length of circuit block i. Specifically, a scan pattern may be modified by pre-padding bits to the scan pattern during scan-in, while masking for the scan-out data. Specifically, in some embodiments described herein, for pre-padding of scan-in data, the first "K-$n_i$" bits of each scan-in may be repeated so that the modification does not affect expected response at scan out. For the scan out, "K-$n_i$" bits may be masked.

Figure 11:
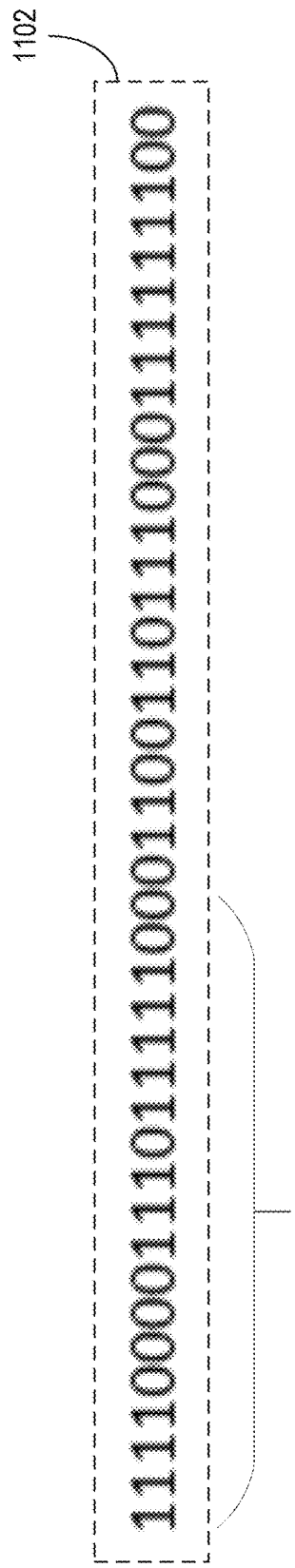
FIGS. 11-12 illustrate an example of modifying a scan pattern in accordance with some embodiments described herein.
Figure 12:
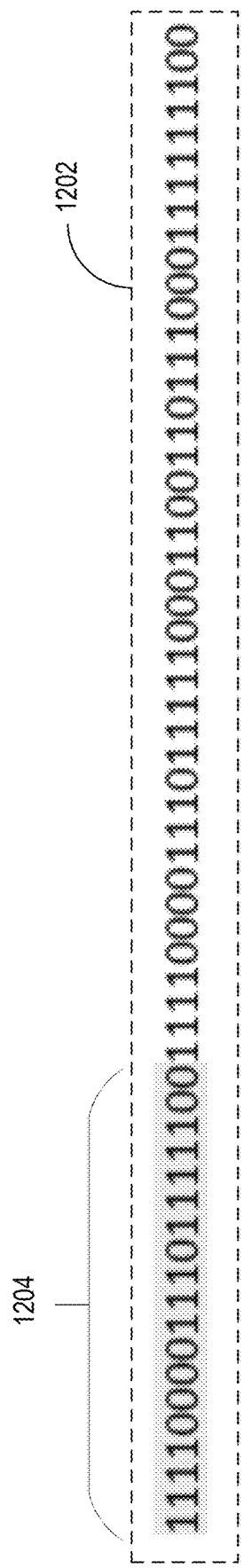

FIGS. 11-12 illustrate an example of modifying a scan pattern in accordance with some embodiments described herein.

In FIG. 11, scan pattern 1102 has a length of 42, which may be used for testing a circuit block. Suppose the δ value for the circuit block is 19 and the modified scan pattern shift length is 61=42+19. The first 19 bits (i.e., bits 1104) in scan pattern 1102 may be pre-padded to scan pattern 1102, which may increase the scan pattern shift length to 61. Modified scan pattern 1202 is shown in FIG. 12. The first 19 bits of scan pattern 1202 (i.e., bits 1204) are the same as the first 19 bits of scan pattern 1102. Embodiments described herein can modify the scan pattern shift length without losing test coverage or requiring changes to the IC design. For X-tolerance enable pins, instead of pre-padding bits, post-padding may be performed to preserve the X-tolerance enable data values during unload. Padding of X-tolerance enable pins may be performed with a "0" value to ensure that the modified scan pattern does not mask any additional scan flops.

FIGS. 13-14 illustrate examples of scan pattern shift length for different IC designs in accordance with some embodiments described herein.

The tables shown in FIGS. 13-14 the following data for three cores Core0, Core1, and Core2: the scan pattern shift length ($n_i$), the $\delta_i$ value, and the modified scan pattern shift length (K). As explained above, the $\delta_i$ value may be computed based on the compression type used in a core, and then the modified scan pattern shift length may be computed for each core. Using a shift length that is less than the shift length computed by embodiments described herein may cause incorrect testing, which may cause the test patterns to fail.

In the example shown in FIG. 13, it may be determined that Core1 does not need any scan pattern shift length modification, while the scan pattern shift lengths for Core0 and Core2 may be increased to 200 with a δ value of 8 and 21, respectively. In the example shown in FIG. 14, which may have a different compression type than FIG. 13, embodiments described herein may adjust the scan pattern shift length for all three cores to 73.

Figure 15:
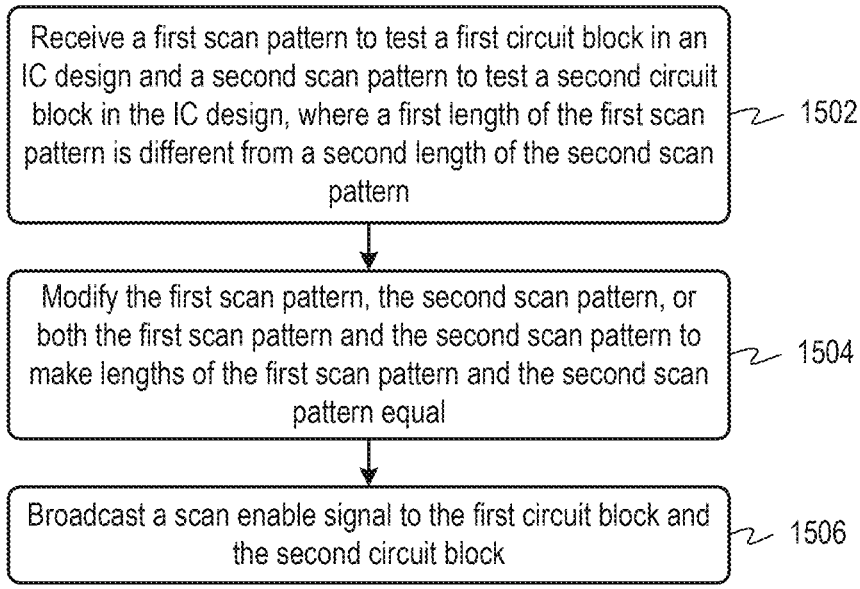
FIG. 15 illustrates a process for modifying scan patterns to enable broadcasting a scan enable signal to multiple circuit blocks in accordance with some embodiments described herein.

FIG. 15 illustrates a process for modifying scan patterns to enable broadcasting a scan enable signal to multiple circuit blocks in accordance with some embodiments described herein.

A first scan pattern may be received to test a first circuit block in an IC design and a second scan pattern may be received to test a second circuit block in the IC design (at 1502). For example, waveforms 102 and 122 in FIG. 1A illustrate a first scan pattern and a second scan pattern, respectively, which have different lengths and which are used for testing different circuit blocks.

A first length of the first scan pattern may be different from a second length of the second scan pattern. The first scan pattern, the second scan pattern, or both the first scan pattern and the second scan pattern may be modified to make lengths of the first scan pattern and the second scan pattern equal (at 1504). A scan enable signal may be broadcast to the first circuit block and the second circuit block (at 1506).

Modifying the first scan pattern may include determining a first value based on scan chain lengths in the first circuit block and increasing the first length of the first scan pattern by at least the first value. The first value may be a first difference between a longest scan chain length and a shortest scan chain length in the first circuit block. Modifying the second scan pattern may include determining a second value based on scan chain lengths in the second circuit block and increasing the second length of the second scan pattern by at least the second value. The second value may be a second difference between a longest scan chain length and a shortest scan chain length in the second circuit block.

For example, the delta values in FIG. 3 are the differences between the longest and the shortest scan chains for the three cores. Next, the length of the first scan pattern may be increased by at least the first difference and the length of the second scan pattern may be increased by at least the second difference, so that the adjusted lengths of the first scan pattern and the second scan pattern are the same. For example, the lengths of the scan patterns for Core1, Core2, and Core3 in FIG. 4 may be increased by 10, 7, and 5, respectively, so that the adjusted lengths of the three scan patterns are equal to 110.

Modifying the first scan pattern may include pre-padding or post-padding the first scan pattern and modifying the first scan pattern may include pre-padding or post-padding the first scan pattern. Pre-padding the first scan pattern may include adding a portion of the first scan pattern to the front of the first scan pattern and pre-padding the second scan pattern may include adding a portion of the second scan pattern to the front of the second scan pattern. For example, bits 1104 may be added to the front of scan pattern 1102 to obtain modified scan pattern 1202.

Figure 16:
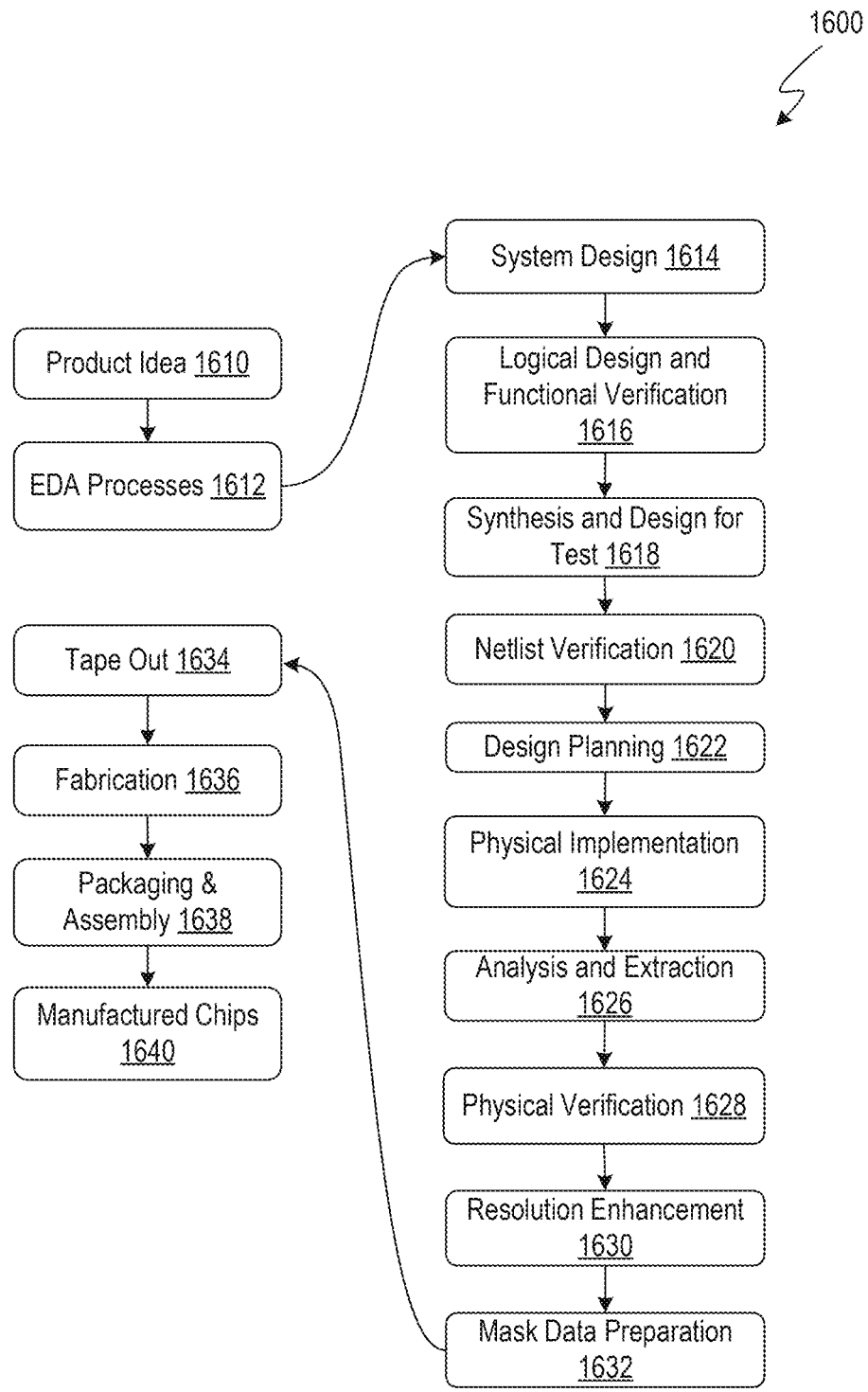
FIG. 16 illustrates an example flow for the design, verification, and fabrication of an integrated circuit in accordance with some embodiments described herein.

FIG. 16 illustrates an example flow for the design, verification, and fabrication of an integrated circuit in accordance with some embodiments described herein.

EDA processes 1612 (the acronym "EDA" refers to "Electronic Design Automation") can be used to transform and verify design data and instructions that represent the integrated circuit. Each of these processes can be structured and enabled as multiple modules or operations.

Flow 1600 can start with the creation of a product idea 1610 with information supplied by a designer, information which is transformed and verified by using EDA processes 1612. When the design is finalized, the design is taped-out 1634, which is when artwork (e.g., geometric patterns) for the integrated circuit is sent to a fabrication facility to manufacture the mask set, which is then used to manufacture the integrated circuit. After tape-out, a semiconductor die is fabricated 1636 and packaging and assembly 1638 are performed to produce the manufactured IC chip 1640.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 1614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 1618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1620, the netlist is checked for compliance with timing constraints and for correspondence with the HDL code. During design planning 1622, an overall floor plan for the integrated circuit is constructed and analyzed for timing and top-level routing.

During layout or physical implementation 1624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1626, the circuit function is verified at the layout level, which permits refinement of the layout design. During physical verification 1628, the layout design is checked to ensure that manufacturing constraints are correct, such as DRC constraints, electrical constraints, lithographic constraints, and that circuitry function matches the HDL design specification. During resolution enhancement 1630, the geometry of the layout is transformed to improve how the circuit design is manufactured.

During tape-out, data is created to be used (after lithographic enhancements are applied if appropriate) for production of lithography masks. During mask data preparation 1632, the 'tape-out' data is used to produce lithography masks that are used to produce finished integrated circuits.

A storage subsystem of a computer system (such as computer system 1700 in FIG. 17) may be used to store the programs and data structures that are used by embodiments described herein.

Figure 17:
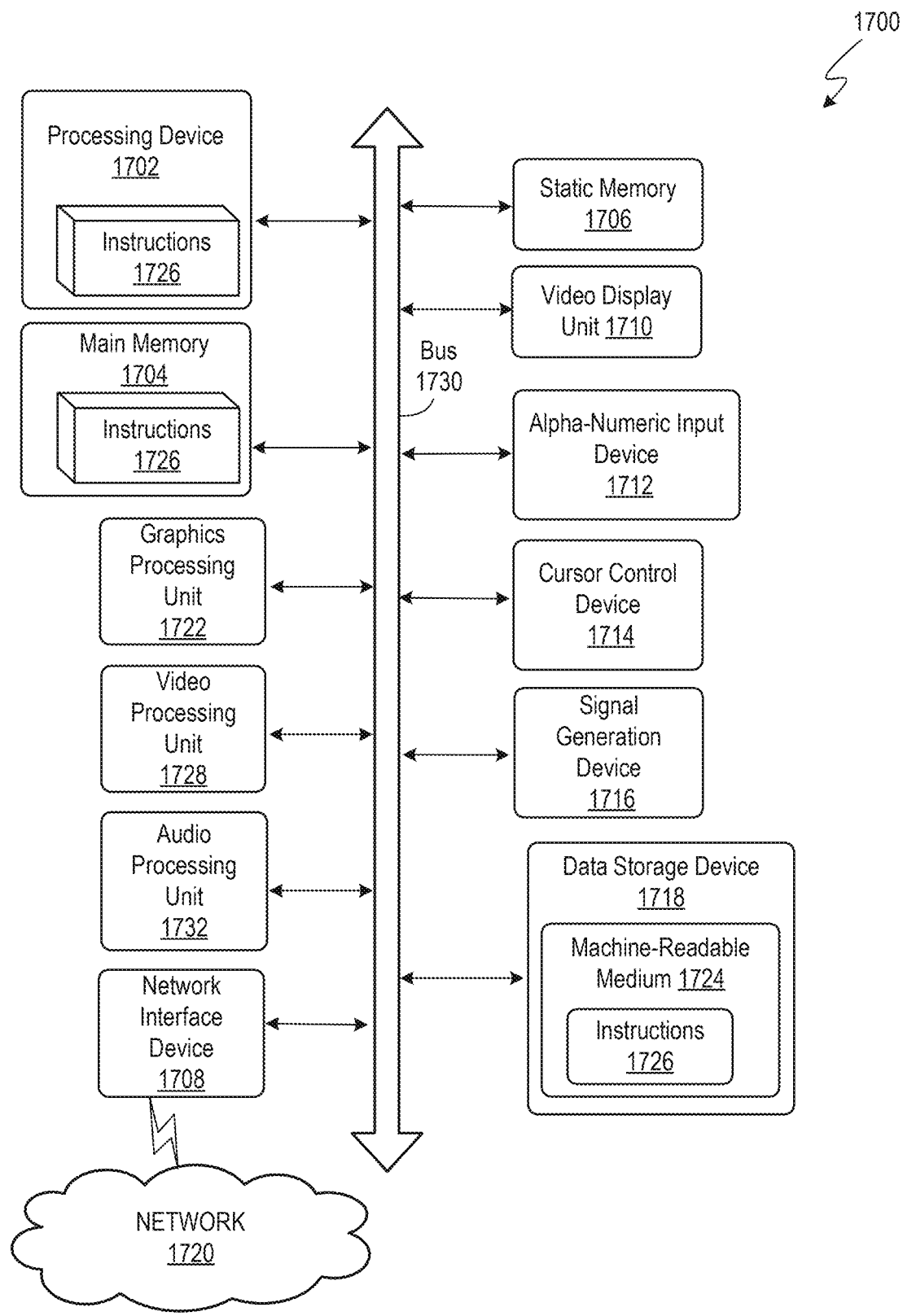
FIG. 17 illustrates an example machine of a computer system within which a set of instructions, for causing the machine to perform any one or more of the methodologies discussed herein, may be executed.

FIG. 17 illustrates an example machine of a computer system within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

Processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704 and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
receiving a first scan pattern to test a first circuit block in an integrated circuit (IC) design and a second scan pattern to test a second circuit block in the IC design, wherein a first length of the first scan pattern is different from a second length of the second scan pattern; and
modifying, by a processor, the first scan pattern, the second scan pattern, or both the first scan pattern and the second scan pattern to make lengths of the first scan pattern and the second scan pattern equal.

2. The method of claim 1, further comprising broadcasting a scan enable signal to the first circuit block and the second circuit block.

3. The method of claim 1, wherein the modifying the first scan pattern, the second scan pattern, or both the first scan pattern and the second scan pattern comprises:
determining a first value based on scan chain lengths in the first circuit block; and
increasing the first length of the first scan pattern by at least the first value.

4. The method of claim 3, wherein the first value is a first difference between a longest scan chain length and a shortest scan chain length in the first circuit block.

5. The method of claim 1, wherein the modifying the first scan pattern, the second scan pattern, or both the first scan pattern and the second scan pattern comprises:
determining a second value based on scan chain lengths in the second circuit block; and
increasing the second length of the second scan pattern by at least the second value.

6. The method of claim 5, wherein the second value is a second difference between a longest scan chain length and a shortest scan chain length in the second circuit block.

7. The method of claim 1, wherein the modifying the first scan pattern, the second scan pattern, or both the first scan pattern and the second scan pattern comprises pre-padding the first scan pattern, the second scan pattern, or both the first scan pattern and the second scan pattern.

8. The method of claim 7, wherein pre-padding the first scan pattern comprises adding a portion of the first scan pattern to the front of the first scan pattern, and wherein pre-padding the second scan pattern comprises adding a portion of the second scan pattern to the front of the second scan pattern.

9. The method of claim 1, wherein the modifying the first scan pattern, the second scan pattern, or both the first scan pattern and the second scan pattern comprises post-padding the first scan pattern, the second scan pattern, or both the first scan pattern and the second scan pattern.

10. A non-transitory computer-readable medium comprising stored instructions, which when executed by a processor, cause the processor to:

receive a first scan pattern to test a first circuit block in an integrated circuit (IC) design and a second scan pattern to test a second circuit block in the IC design, wherein a first length of the first scan pattern is different from a second length of the second scan pattern, and wherein a scan enable signal is desired to be broadcast to the first circuit block and the second circuit block; and
modify the first scan pattern, the second scan pattern, or both the first scan pattern and the second scan pattern to make lengths of the first scan pattern and the second scan pattern equal.

11. The non-transitory computer-readable medium of claim 10, wherein the modifying the first scan pattern, the second scan pattern, or both the first scan pattern and the second scan pattern comprises:
determining a first value based on scan chain lengths in the first circuit block; and
increasing the first length of the first scan pattern by at least the first value.

12. The non-transitory computer-readable medium of claim 11, wherein the first value is a first difference between a longest scan chain length and a shortest scan chain length in the first circuit block.

13. The non-transitory computer-readable medium of claim 10, wherein the modifying the first scan pattern, the second scan pattern, or both the first scan pattern and the second scan pattern comprises:
determining a second value based on scan chain lengths in the second circuit block; and
increasing the second length of the second scan pattern by at least the second value.

14. The non-transitory computer-readable medium of claim 13, wherein the second value is a second difference between a longest scan chain length and a shortest scan chain length in the second circuit block.

15. The non-transitory computer-readable medium of claim 10, wherein the modifying the first scan pattern, the second scan pattern, or both the first scan pattern and the second scan pattern comprises pre-padding the first scan pattern, the second scan pattern, or both the first scan pattern and the second scan pattern.

16. The non-transitory computer-readable medium of claim 15, wherein pre-padding the first scan pattern comprises adding a portion of the first scan pattern to the front of the first scan pattern, and wherein pre-padding the second scan pattern comprises adding a portion of the second scan pattern to the front of the second scan pattern.

17. The non-transitory computer-readable medium of claim 10, wherein the modifying the first scan pattern, the second scan pattern, or both the first scan pattern and the second scan pattern comprises post-padding the first scan pattern, the second scan pattern, or both the first scan pattern and the second scan pattern.

18. An apparatus, comprising:
a memory storing instructions; and
a processor, coupled with the memory and to execute the instructions, the instructions when executed causing the processor to:
receive a first scan pattern to test a first circuit block in an integrated circuit (IC) design and a second scan pattern to test a second circuit block in the IC design, wherein a first length of the first scan pattern is different from a second length of the second scan pattern; and modify the first scan pattern and the second scan pattern to make lengths of the first scan pattern and the second scan pattern equal, wherein the modifying comprises:
- determining a first value based on scan chain lengths in the first circuit block and a second value based on scan chain lengths in the second circuit block, and
- increasing the first length of the first scan pattern by at least the first value and the second length of the second scan pattern by at least the second value.

19. The apparatus of claim 18, wherein the first value is a first difference between a longest scan chain length and a shortest scan chain length in the first circuit block.

20. The apparatus of claim 18, wherein the second value is a second difference between a longest scan chain length and a shortest scan chain length in the second circuit block.

\* \* \* \* \*